United States Patent
Chong et al.

(10) Patent No.: US 10,658,346 B2
(45) Date of Patent: May 19, 2020

(54) MAKING SEMICONDUCTOR DEVICES BY STACKING STRATA OF MICRO LEDS

(71) Applicant: HONG KONG BEIDA JADE BIRD DISPLAY LIMITED, Hong Kong (CN)

(72) Inventors: Wing Cheung Chong, Hong Kong (CN); Lei Zhang, Hong Kong (CN); Qiming Li, Hong Kong (CN); Jen-Shyan Chen, Hong Kong (CN)

(73) Assignee: Hong Kong Beida Jade Bird Display Limited, Hong Kong (CN)

( * ) Notice: Subject to any disclaimer, the term of this patent is extended or adjusted under 35 U.S.C. 154(b) by 102 days.

(21) Appl. No.: 16/076,315

(22) PCT Filed: Mar. 19, 2018

(86) PCT No.: PCT/US2018/023172
§ 371 (c)(1),
(2) Date: Aug. 7, 2018

(87) PCT Pub. No.: WO2018/175338
PCT Pub. Date: Sep. 27, 2018

(65) Prior Publication Data
US 2020/0035653 A1     Jan. 30, 2020

Related U.S. Application Data

(60) Provisional application No. 62/473,953, filed on Mar. 20, 2017.

(51) Int. Cl.
    H01L 25/07     (2006.01)
    H01L 33/60     (2010.01)
    (Continued)

(52) U.S. Cl.
    CPC ........ H01L 25/0756 (2013.01); G09G 3/2003 (2013.01); G09G 3/32 (2013.01);
    (Continued)

(58) Field of Classification Search
    CPC ...... H01L 25/0756; H01L 33/60; H01L 33/62; G09G 3/2003; G09G 3/32
    See application file for complete search history.

(56) References Cited

U.S. PATENT DOCUMENTS

| | | | |
|---|---|---|---|
| 8,089,079 B2 * | 1/2012 | Lee | H01L 25/0753 257/100 |
| 9,443,833 B2 * | 9/2016 | Oraw | H01L 25/0753 |

(Continued)

OTHER PUBLICATIONS

PCT International Search Report and Written Opinion, PCT/US2018/023172, dated Jun. 11, 2018, 24 Pages.

*Primary Examiner* — Ida M Soward
(74) *Attorney, Agent, or Firm* — Fenwick & West LLP

(57) ABSTRACT

A stack of strata containing LEDs is fabricated by repeatedly bonding unpatterned epitaxial structures. Because the epitaxial structures are unpatterned (e.g., not patterned into individual micro LEDs), requirements on alignment are significantly relaxed. One example is an integrated multi-color LED display panel, in which arrays of micro LEDs are integrated with corresponding driver circuitry. Multiple strata of micro LEDs are stacked on top of a base substrate that includes the driver circuitry. In this process, each stratum is fabricated as follows. An unpatterned epitaxial structure is bonded on top of the existing device. The epitaxial structure is then patterned to form micro LEDs. The stratum is filled and planarized to allow the unpatterned epitaxial structure of the next stratum to be bonded. This is repeated to build up the stack of strata.

20 Claims, 19 Drawing Sheets

(51) Int. Cl.
*H01L 33/62* (2010.01)
*G09G 3/20* (2006.01)
*G09G 3/32* (2016.01)
*H01L 25/075* (2006.01)

(52) U.S. Cl.
CPC .............. *H01L 33/60* (2013.01); *H01L 33/62* (2013.01); *H01L 25/0753* (2013.01)

(56) References Cited

U.S. PATENT DOCUMENTS

| | | | |
|---|---|---|---|
| 2003/0213967 A1* | 11/2003 | Forrest | C09K 11/06 |
| | | | 257/96 |
| 2012/0223875 A1 | 9/2012 | Lau | |
| 2012/0256200 A1* | 10/2012 | Yao | H01L 27/156 |
| | | | 257/88 |
| 2014/0367708 A1* | 12/2014 | Sorg | H01L 25/0753 |
| | | | 257/88 |
| 2015/0357315 A1 | 12/2015 | Oraw | |
| 2015/0360606 A1* | 12/2015 | Thompson | B60Q 3/252 |
| | | | 362/490 |
| 2015/0372052 A1 | 12/2015 | Bower et al. | |
| 2016/0163940 A1* | 6/2016 | Huang | H01L 33/62 |
| | | | 257/89 |
| 2017/0069609 A1 | 3/2017 | Zhang et al. | |
| 2019/0229234 A1* | 7/2019 | Zou | G09F 9/33 |
| 2019/0237618 A1* | 8/2019 | Zou | H01L 25/0753 |

\* cited by examiner

MAKING SEMICONDUCTOR DEVICES BY STACKING STRATA OF MICRO LEDS

CROSS-REFERENCE TO RELATED APPLICATION(S)

This application claims priority under 35 U.S.C. § 119(e) to U.S. Provisional Patent Application Ser. No. 62/473,953, entitled "Micro-LED Display Chip and Method of Making Same," filed on Mar. 20, 2017. The subject matter of all of the foregoing is incorporated herein by reference in their entirety.

BACKGROUND

1. Field of the Invention

This disclosure relates generally to methods for fabricating semiconductor devices, for example, methods for fabricating integrated multi-color LED display panels.

2. Description of Related Art

Active matrix liquid-crystal displays (LCD) and organic light emitting diode (OLED) displays combined with thin-film transistor (TFT) technology are becoming increasingly popular in today's commercial electronic devices. These displays are widely used in laptop personal computers, smartphones and personal digital assistants. Millions of pixels together create an image on a display. The TFTs act as switches to individually turn each pixel on and off, rendering the pixel light or dark, which allows for convenient and efficient control of each pixel and of the entire display.

However, conventional LCD displays suffer from low light efficiency, causing high power consumption and limited battery operation time. While active-matrix organic light-emitting diode (AMOLED) display panels generally consume less power than LCD panels, an AMOLED display panel can still be the dominant power consumer in battery-operated devices. To extend battery life, it is desirable to reduce the power consumption of the display panel.

Conventional inorganic semiconductor light emitting diodes (LED) have demonstrated superior light efficiency, which makes active matrix LED displays more desirable for battery operated electronics. Arrays of driver circuitry and lighting-emitting diodes (LEDs) are used to control millions of pixels, rendering images on the display. Both single-color display panels and full-color display panels can be manufactured according to a variety of fabrication methods.

However, the integration of thousands or even millions of micro LEDs with pixel driver circuit array is quite challenging. Various fabrication methods have been proposed. In one approach, control circuitry is fabricated on one substrate and LEDs are fabricated on a separate substrate. The LEDs are transferred to an intermediate substrate and the original substrate is removed. Then the LEDs on the intermediate substrate are picked and placed one or a few at a time onto the substrate with the control circuitry. However, this fabrication process is inefficient and costly. In addition, there are no existing manufacturing tools for mass transferring micro LEDs. Therefore new tools must be developed.

In another approach, the entire LED array with its original substrate is aligned and bonded to the control circuitry using metal bonding. The substrate on which the LEDs are fabricated remains in the final product, which may cause light cross-talk. Additionally, the thermal mismatch between the two different substrates generates stress at the bonding interface, which can cause reliability issues. Furthermore, multi-color display panels typically require more LEDs and different color LEDs grown on different substrate materials, compared with single-color display panels, thus making the traditional manufacturing process even more complicated and inefficient.

As a result, there is a need for better manufacturing methods.

SUMMARY

The present disclosure overcomes the limitations of the prior art by using multiple stages of bonding unpatterned epitaxial structures. Because the epitaxial structures are unpatterned (e.g., not patterned into individual micro LEDs), requirements on alignment are significantly relaxed.

One example is an integrated multi-color LED display panel, in which arrays of micro LEDs are integrated with corresponding driver circuitry. The driver circuitry typically is an array of pixel drivers that drive the LEDs on the display panel. The array of pixel drivers is fabricated on a supporting substrate. Multiple strata of micro LEDs are then stacked on top of the base substrate. In this process, each stratum is fabricated as follows. An unpatterned epitaxial structure is bonded on top of the existing device. The epitaxial structure is then patterned to form micro LEDs. The stratum is filled and planarized to allow the unpatterned epitaxial structure of the next stratum to be bonded. This is repeated to build up the stack of strata.

Other aspects include components, devices, systems, improvements, methods, processes, applications and other technologies related to any of the above.

BRIEF DESCRIPTION OF THE DRAWINGS

Embodiments of the disclosure have other advantages and features which will be more readily apparent from the following detailed description and the appended claims, when taken in conjunction with the accompanying drawings, in which:

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1A:
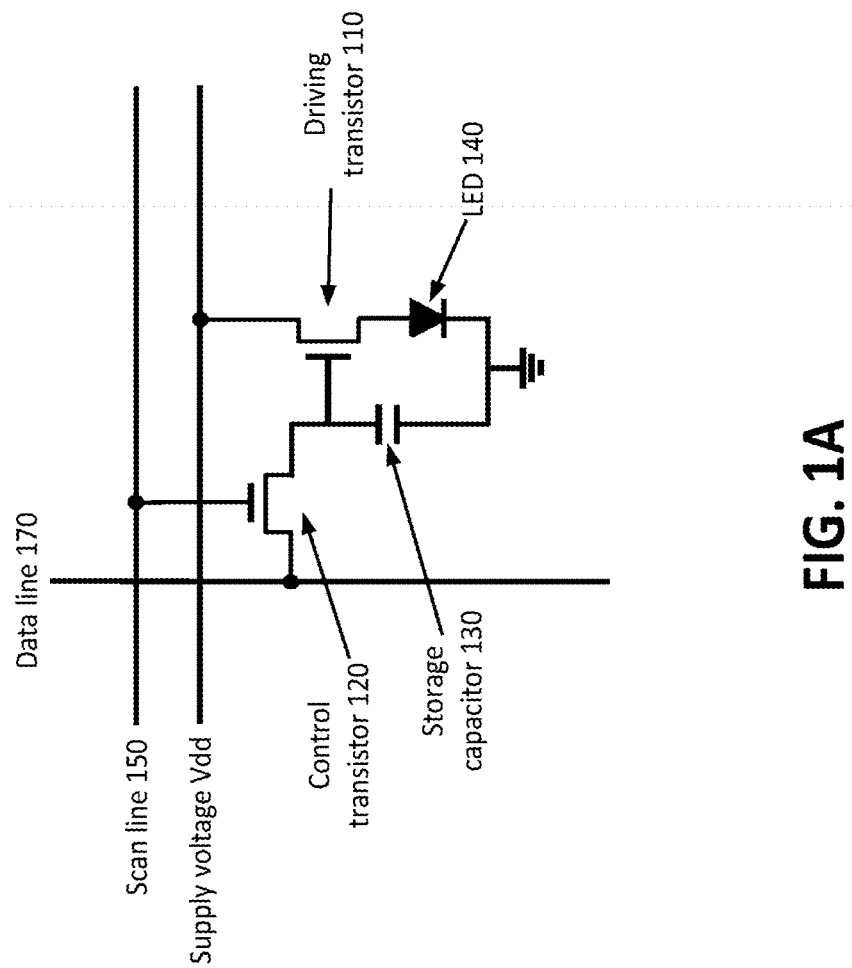
FIG. 1A is a circuit diagram of a pixel of a display panel, according to one embodiment.

FIG. 1A is a circuit diagram of a pixel of a display panel, which includes a pixel driver and LED 140, such as micro LEDs. Micro LEDs typically have a lateral dimension of 50 microns (um) or less, and can have lateral dimensions less than 10 um and even just a few um. In this example, the pixel driver includes two transistors and one capacitor 130, with one transistor being a control transistor 120 and the other being a driving transistor 110. In this example, the control transistor 120 is configured with its gate connected to a scan signal bus line 150, its one source/drain connected to a data signal bus line 170, and the other drain/source connected to the storage capacitor 130 and to the gate of the driving transistor 110. One source/drain of the driving transistor 110 is connected to a voltage supply, Vdd, and the other drain/source is connected to the p-electrode of the LED 140. The n-electrode of the LED 140 is connected to the capacitor 130 and to ground. In this example, when the scan signal 150 opens the gate of the control transistor 120, the data signal 170 charges the storage capacitor 130 and sets the driving transistor 110's gate voltage, which controls the current flow through the LED 140. The storage capacitor 130 here is used to maintain the gate voltage of the driving transistor 110, thus maintaining the current flowing through the LED 140 during the time that the scan signal 150 is setting other pixels. Other pixel driver designs will be apparent, for example as described in U.S. patent application Ser. No. 12/214,395, "Monolithic Active or Passive Matrix LED Array Display Panels and Display Systems Having the Same," which is incorporated herein by reference.

The following examples primarily use an integrated micro LED display in which array(s) of GaN micro LEDs are integrated with CMOS pixel drivers, but these are just examples and the techniques described are not limited to this particular application. Examples of micro LEDs include GaN based UV/blue/green micro LEDs, AlInGaP based red/orange micro LEDs, and GaAs or InP based infrared (IR) micro LEDs. Additional examples of micro LEDs and other micro structures are described in U.S. patent application Ser. No. 15/135,217 "Semiconductor Devices with Integrated Thin-Film Transistor Circuitry", Ser. No. 15/269,954 "Making Semiconductor Devices with Alignment Bonding and Substrate Removal", Ser. No. 15/269,956 "Display Panels with Integrated Micro Lens Array", Ser. No. 15/272,410 "Manufacturing Display Panels with Integrated Micro Lens Array", and Ser. No. 15/701,450 "Multi-Color Micro-LED Array Light Source". All of the foregoing are incorporated by reference in their entirety.

Figure 1B:
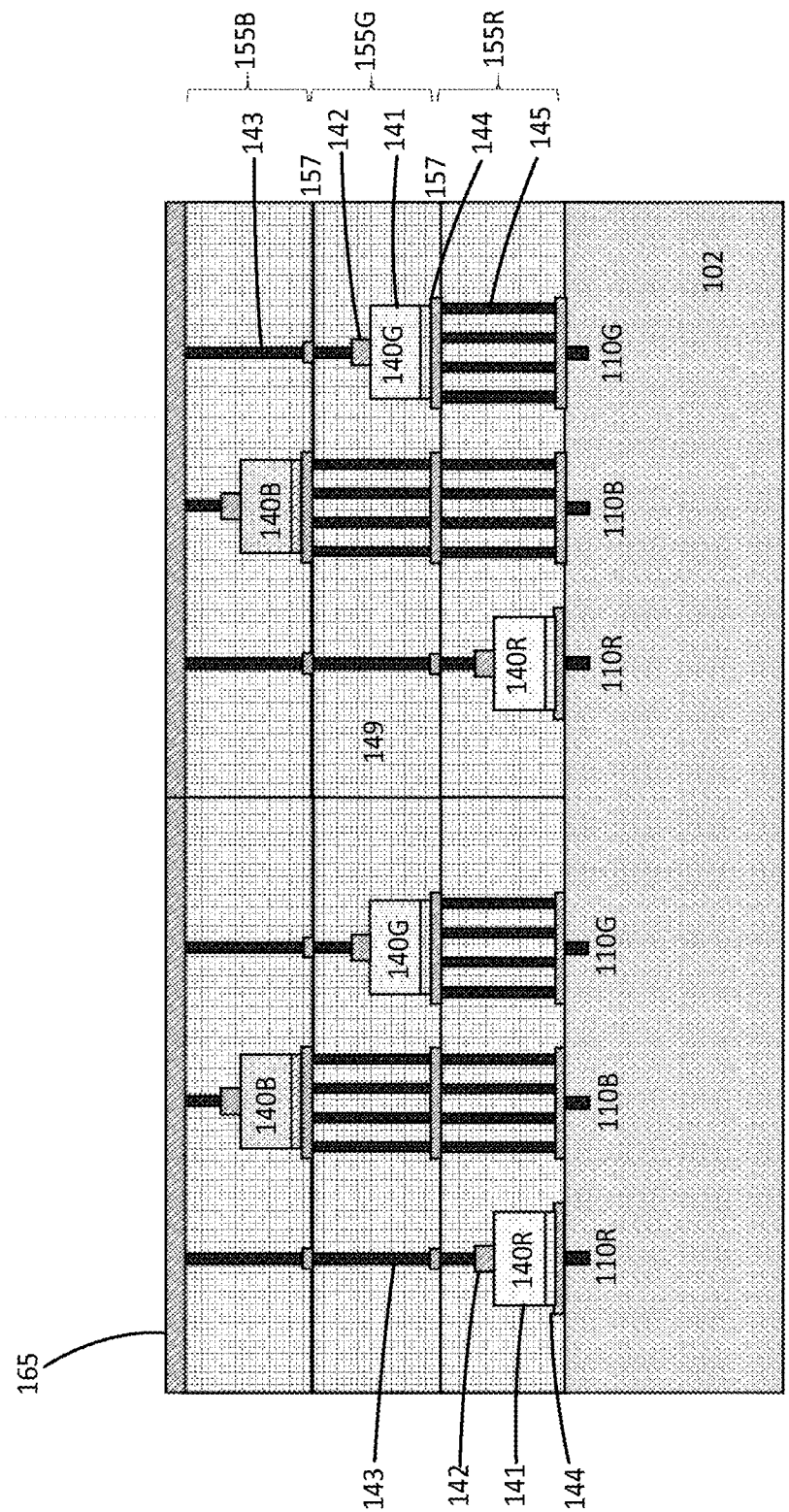
FIG. 1B is a cross-sectional view of several pixels of an integrated multi-color LED display panel, according to one embodiment.

FIG. 1B is a cross-sectional view of several pixels of an integrated multi-color LED display panel, according to one embodiment. In FIG. 1B, an array of individual driver circuits are fabricated on the supporting substrate 102. The black rectangles 110 shown in FIG. 1B represent electrical connections to the driver circuits, for example the connection between the driving transistor 110 and LED 140 in FIG. 1A. For convenience, these connections 110 may also be referred to as driver circuits 110 or pixel drivers 110. The driver circuits 110 are labeled with suffixes R,G,B, because they correspond to red, green and blue pixels. The array of pixel drivers 110 are electrically connected to micro LEDs 140, which are also labeled with suffixes R,G,B to indicate their color. The micro LEDs 140R,G,B are contained in different strata 155R,G,B, which are stacked on top of the substrate and pixel drivers. The bottom stratum 155R contains the red micro LEDs 140R, the middle stratum 155G contains the green micro LEDs 140G, and the top stratum 155B contains the blue micro LEDs 140B. Which color is in which stratum can vary depending on the design. For convenience, "up" is used to mean away from the substrate 102, "down" means toward the substrate, and other directional terms such as top, bottom, above, below, under, beneath, etc. are interpreted accordingly.

Using the leftmost micro LED 140R as an example, each micro LED is formed from an epitaxial structure 141. Examples include III-V nitride, III-V arsenide, III-V phosphide, and III-V antimonide epitaxial structures. An upper contact metal pad 142 is electrically connected to the top of the micro LED 140 and is also electrically connected to a common electrode 165, using vias 143 through any intervening strata as necessary. For micro LED 140R, the vias 143 connect through strata 155G,B to the common electrode 165. A lower contact metal pad 144 is electrically connected to the bottom of the micro LED 140 and is also electrically connected to the corresponding pixel driver 110, using vias 145 through any intervening strata as necessary. Because micro LED 140R is in the bottom stratum, there are no intervening strata and no vias 145 are used. For the rightmost micro LED 140G, vias 145 electrically connect the lower contact metal pad 144 through intervening stratum 155R to the corresponding pixel driver 110, and vias 143 electrically connect the upper contact metal pad 142 through intervening stratum 155B to the common electrode 165. In this example, each micro LED 140 is connected to a single common electrode 165, but this is not required as will be apparent in alternate designs shown below. For example, connecting different micro LEDs 140 to common electrodes that are not connected to each other allows separate biasing of the micro LEDs 140.

As a result of the fabrication method, which will be described in greater detail below, each strata 155 is filled with material 149 so that the interfaces 157 between adjacent strata are planar. This facilitates fabrication of the next stratum. An example of fill material 149 is silicon dioxide, which is both non-conductive and transparent. This provides electrical isolation between micro LEDs and vias, but also allows light produced by micro LEDs in lower strata to propagate through the stratum. Another example of fill material 149 is silicon nitride. The fill 149 for each stratum does not have to be a single homogenous material. Combinations of materials or structures can also be used. Regardless of the detailed structure, preferably each stratum is transparent in regions that are laterally located above micro LEDs of lower strata, so that light produced by the micro LEDs of the lower strata are able to propagate through such regions.

In more detail, the driver circuitry is fabricated as follows. The supporting substrate 102 is the substrate on which the array of individual driver circuits 110 is fabricated. In one embodiment, the substrate 102 is a Si substrate. In another embodiment, the supporting substrate 102 is a transparent substrate, for example, a glass substrate. Other example substrates include GaAs, GaP, InP, SiC, ZnO, and sapphire substrates. The driver circuits 110 form individual pixel drivers to drive the micro LEDs. The circuitry on substrate 102 includes contacts to each individual pixel driver 110 and also a ground contact. Each micro LED also has two contacts: one 144 connected to the pixel driver and the other 142 connected to ground (i.e., the common electrode).

In alternative embodiments not shown, the driver circuitry can include driver circuits other than CMOS driver circuits.

As one example, the driver circuitry may include thin-film transistor (TFT) driver circuits. As another example, the driver circuitry can be circuitry using III-V compound semiconductors.

For clarity, FIG. 1B shows only six micro LEDs and corresponding pixel drivers. It should be understood that any number of micro LEDs and pixel drivers can be used. In a fully programmable display panel, the LEDs and driver circuits are arranged in arrays to form an array of individually addressable pixels, preferably multi-color pixels. In alternate embodiments, the display panel may have a more limited programmability and the pixels may be arranged in different geometries. In addition, there does not have to be a one to one correspondence between driver circuits and LEDs. For example, there could be two or more LEDs connected to the same pixel driver output to create redundancy, so that if one of the LEDs fails, the remaining LEDs could still light the pixel.

The micro LEDs can also be distributed into strata in different ways and there can also be different numbers of strata. In one approach, the micro LEDs of different strata produce light of different wavelengths, as in the example of FIG. 1B. Colors can include ultraviolet, blue, green, orange, red, and infrared. Here, terms such as light, optical and color are intended to include both ultraviolet and infrared.

Figure 2A:
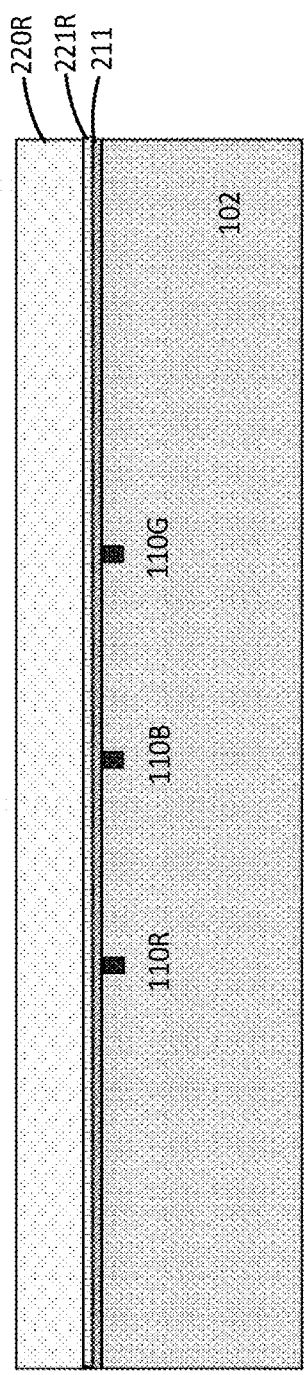
FIGS. 2A-2L are cross-sectional views illustrating fabrication of an integrated multi-color LED display panel by a multi-strata process, according to one embodiment.
Figure 2B:
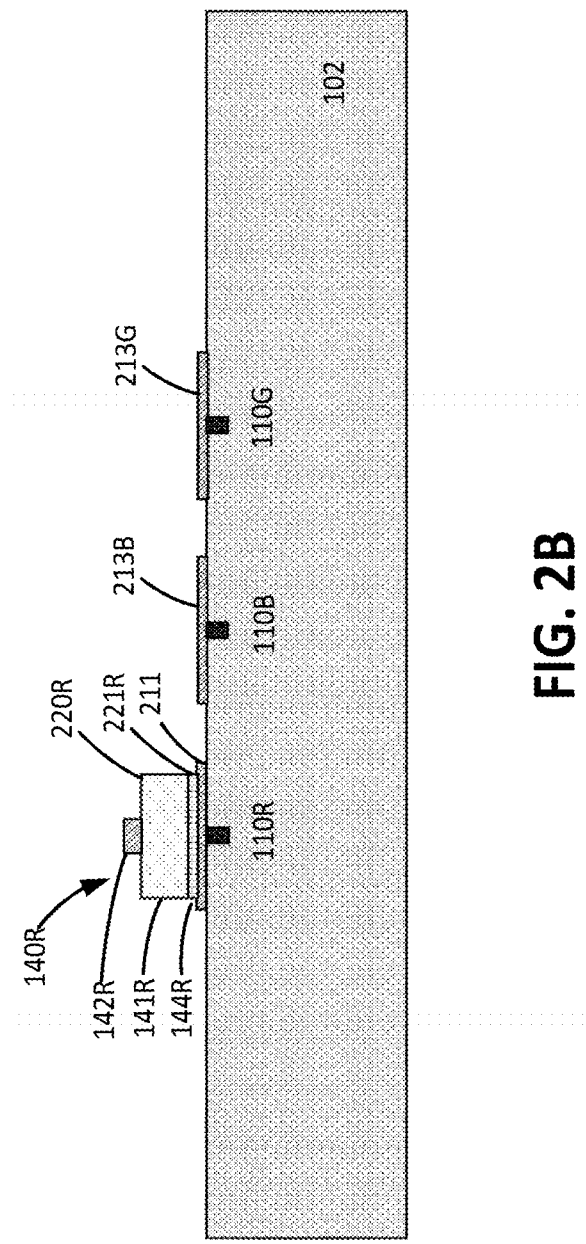
Figure 2C:
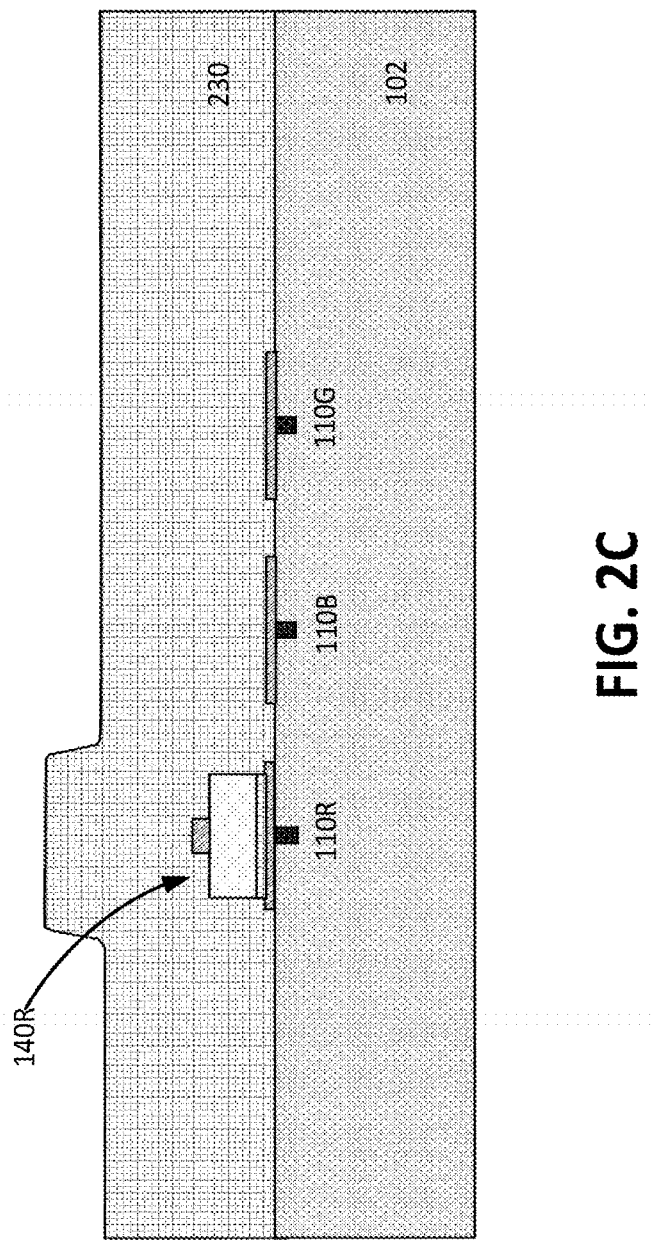
Figure 2D:
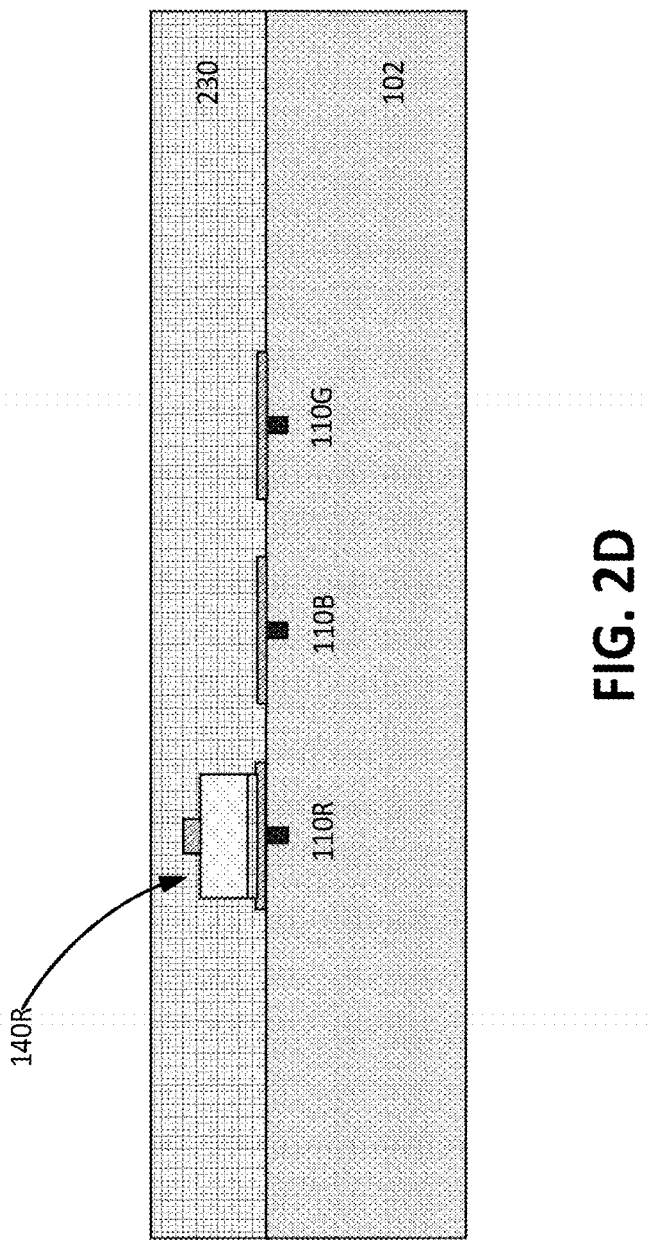
Figure 2E:
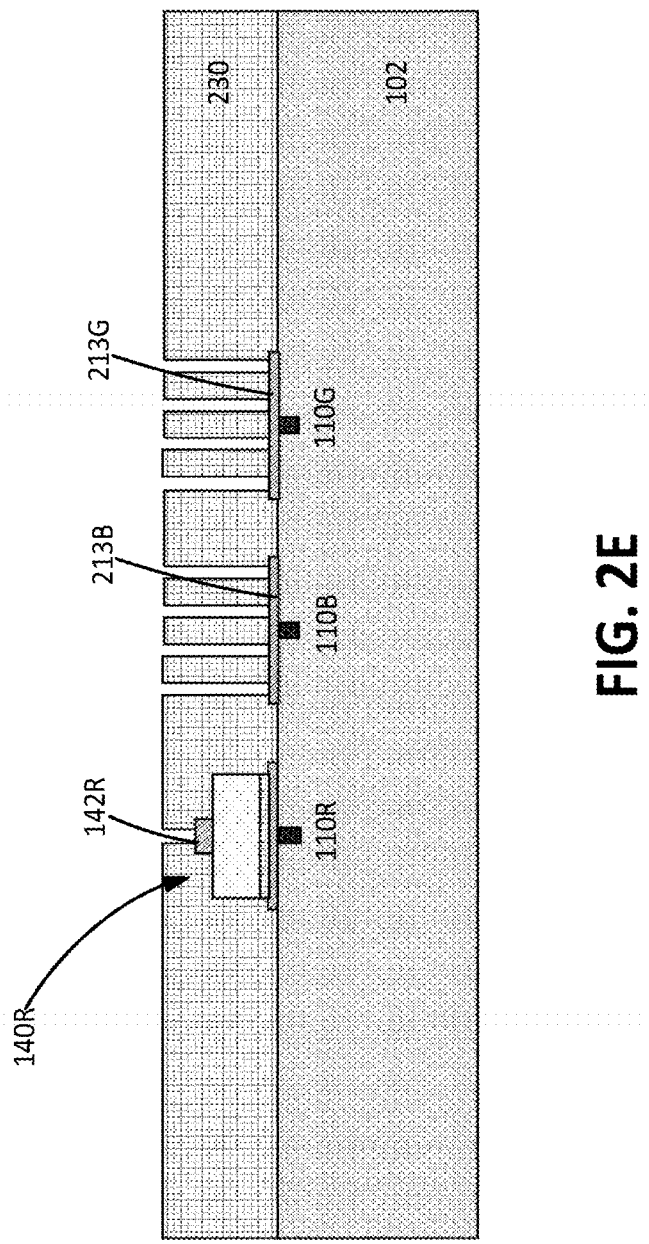
Figure 2F:
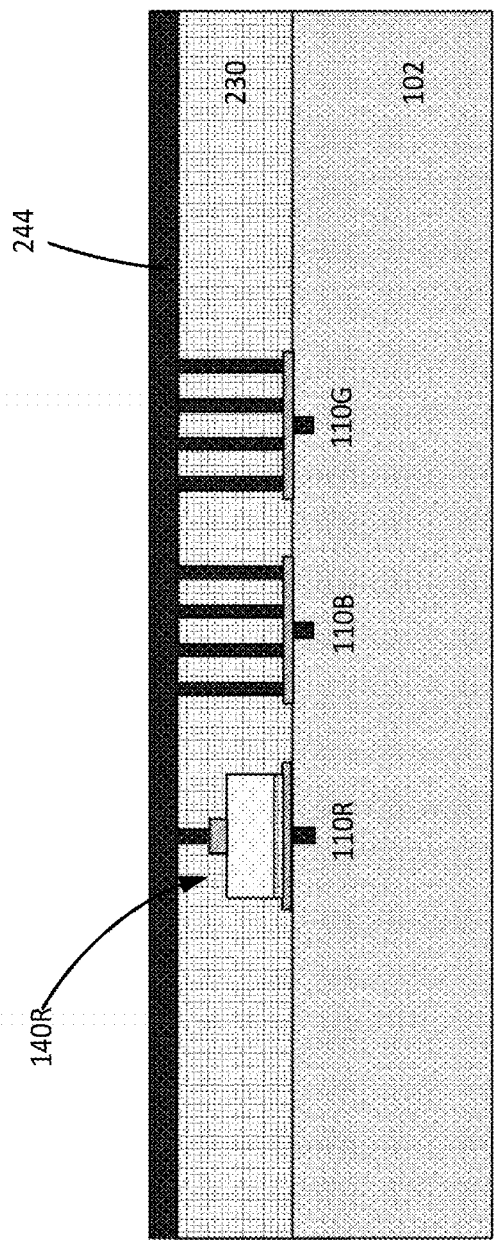
Figure 2G:
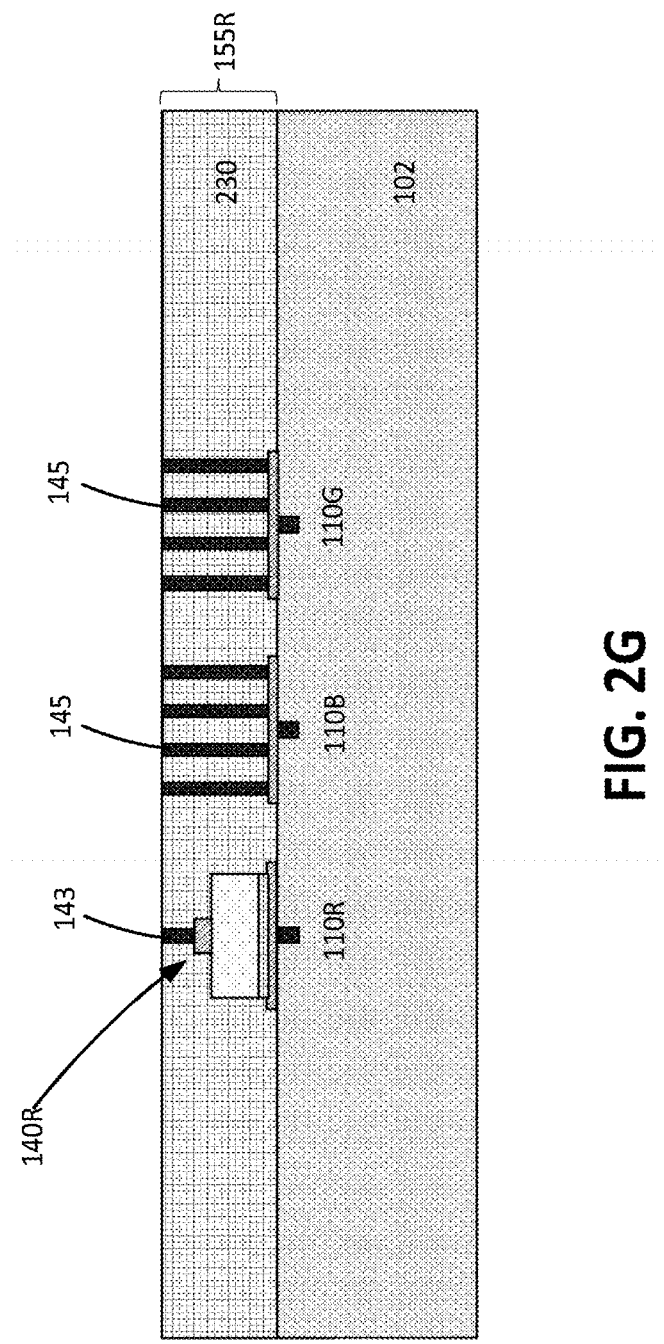
Figure 2H:
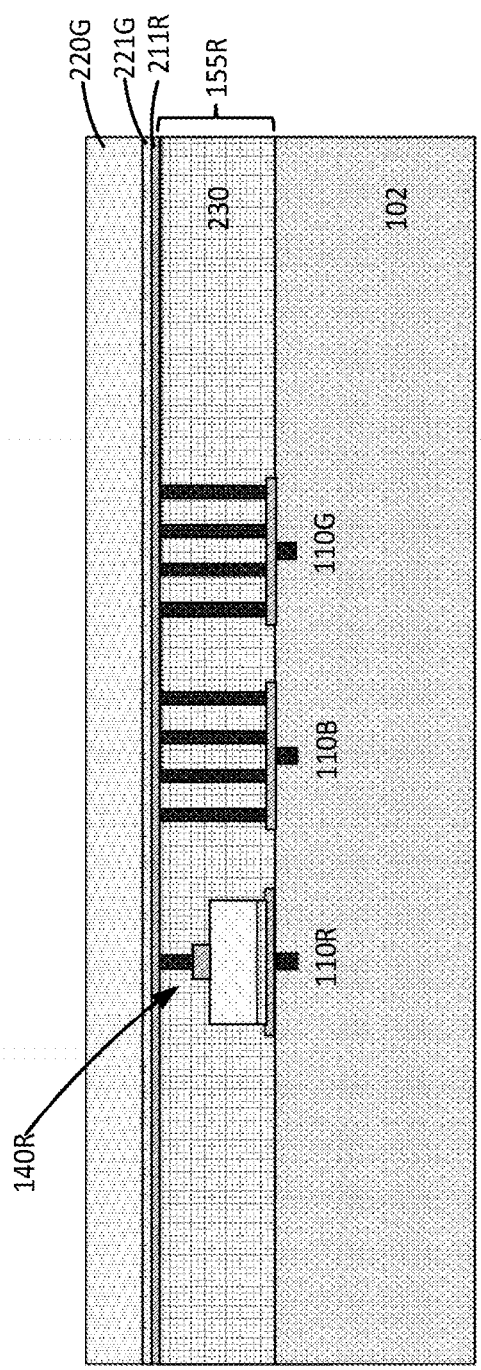
Figure 2I:
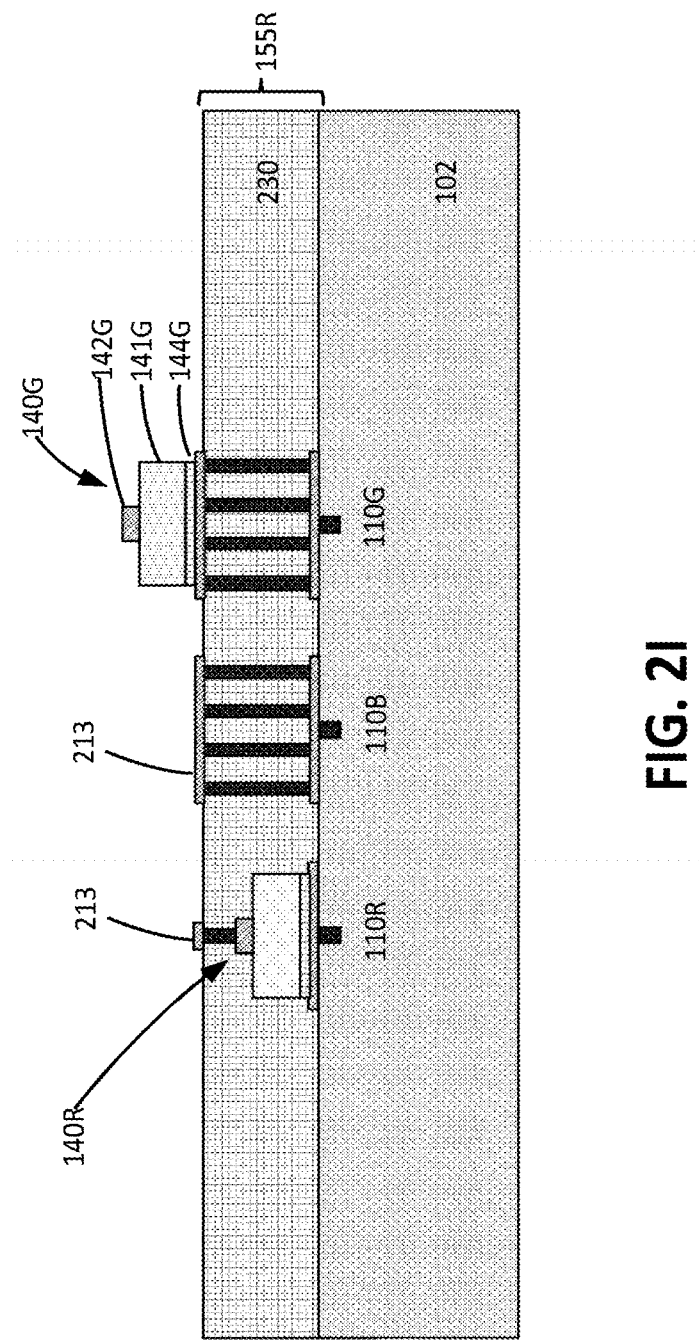
Figure 2J:
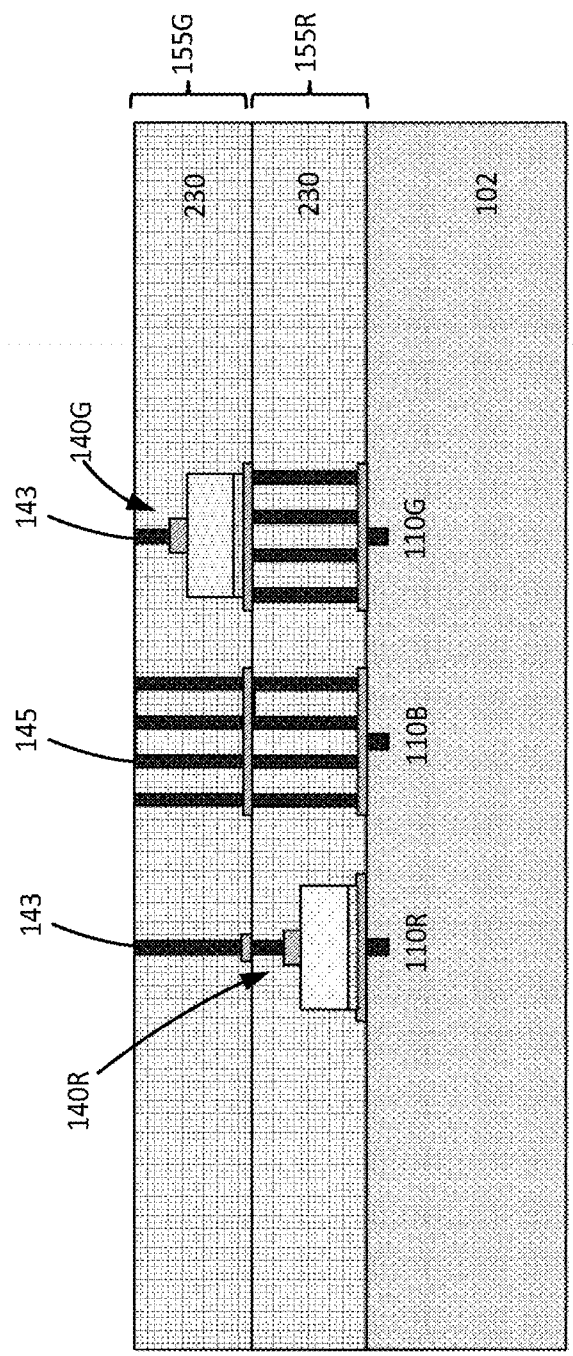
Figure 2K:
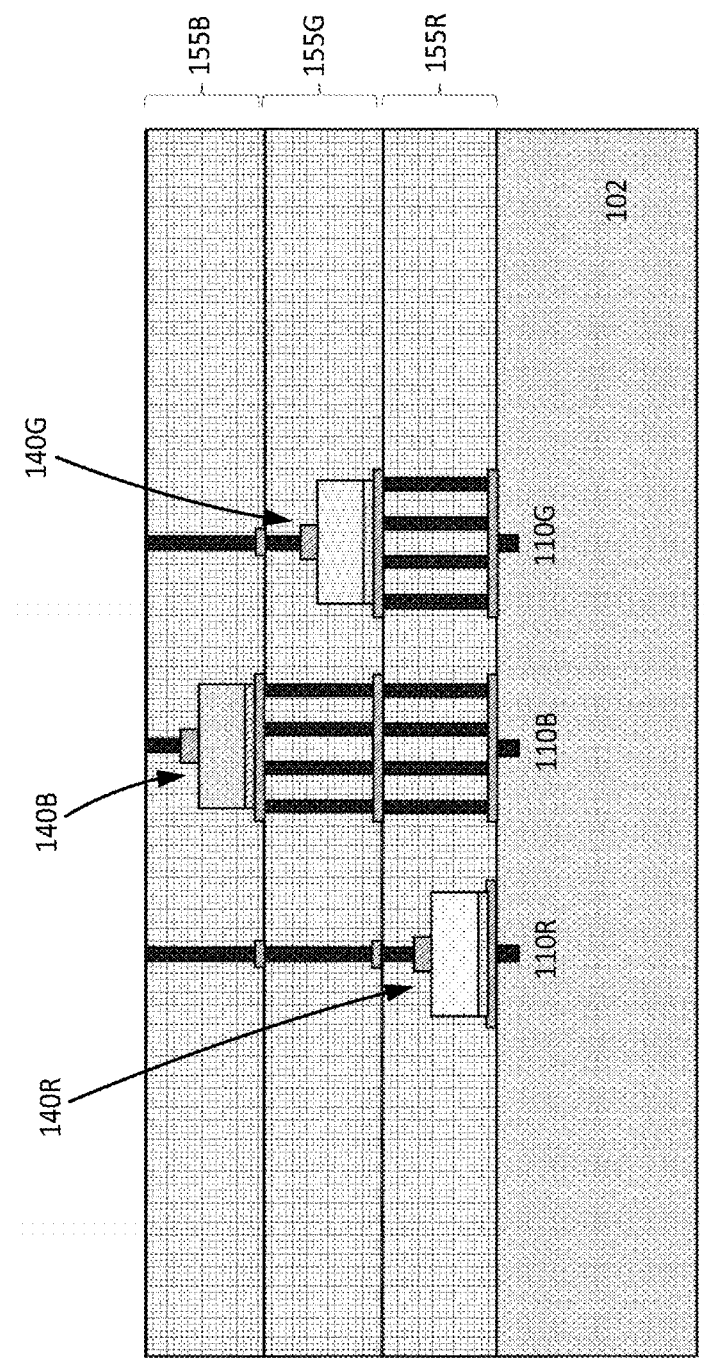
Figure 2L:
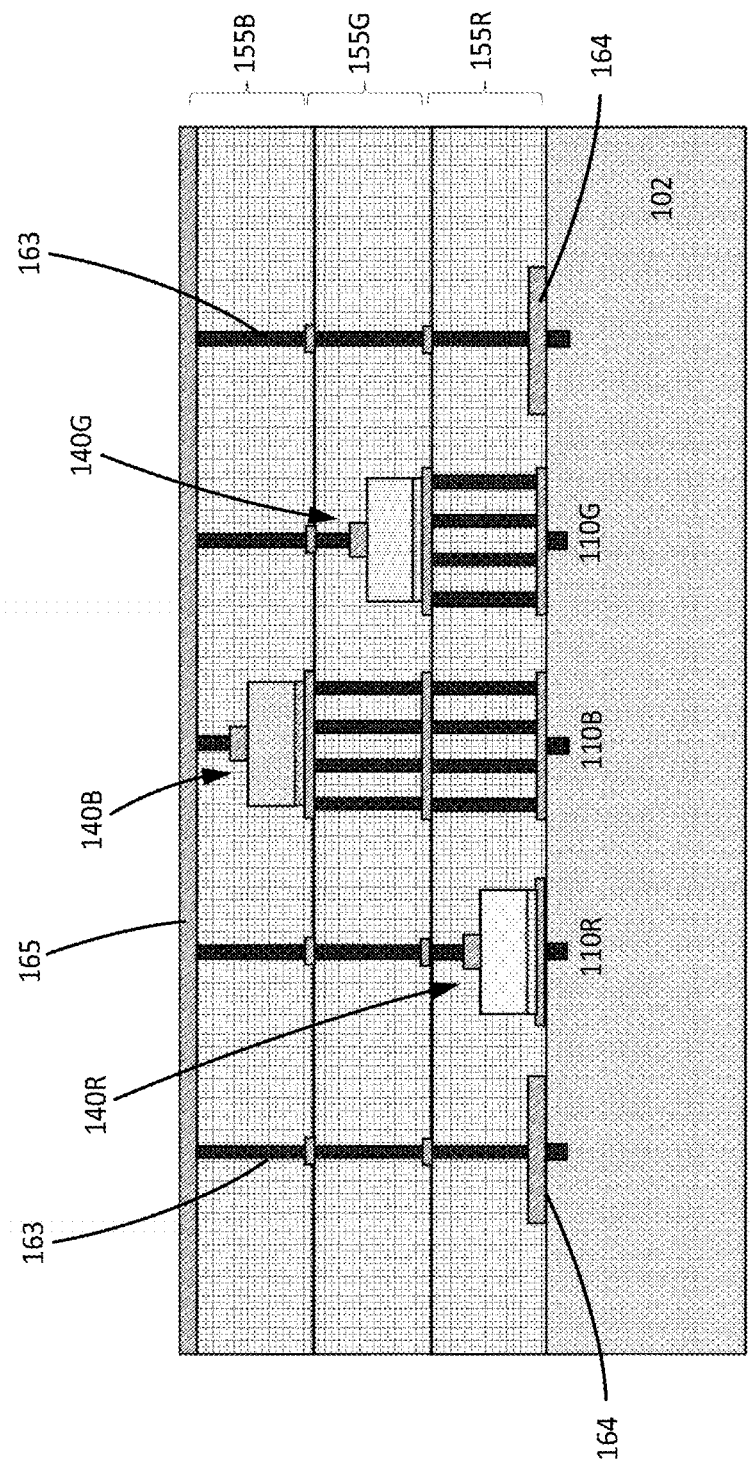

FIGS. 2A-2L are cross-sectional views illustrating fabrication of the integrated multi-color LED display panel of FIG. 1B, using a multi-strata process according to one embodiment. More specifically, FIGS. 2A-2G illustrate fabrication of the bottom stratum 155R with red micro LEDs, FIGS. 2H-2J illustrate fabrication of the middle stratum 155G with green micro LEDs, FIG. 2K illustrates fabrication of the top stratum 155B with blue micro LEDs, and FIG. 2L illustrates fabrication of the common electrode 165.

The cross-sectional view of FIG. 2A shows the substrate 102 supporting pixel drivers 110. For clarity, only the contacts 110 to the pixel drivers are shown. An unpatterned epitaxial structure 220R is bonded on top of the existing structure of substrate with pixel drivers. In one approach, the epitaxial layers 220R are grown on a separate substrate (referred to as the epitaxy substrate). A continuous uniform metal layer 221R is fabricated over the epitaxial layers 220R. The metal bonding layer 221R may include ohmic contact layers, light reflection layers, and metal bonding layers. A counterpart metal bonding layer 211 is also fabricated over the substrate with pixel drivers. The two metal bonding layers 211 and 221R are bonded together. Eutectic bonding, thermal compression bonding, and transient liquid phase (TLP) bonding are some techniques that may be used. The epitaxy substrate is then removed, for example by a laser lift-off process or wet chemical etching, leaving the structure shown in FIG. 2A. Because the epitaxy structure 220R is unpatterned, there is no need for fine alignment, as would be the case if a previously fabricated array of LEDs were bonded to the array of pixel drivers.

In FIG. 2B, the epitaxial structure 220R and bonding layers 211,221R are patterned. The epitaxial structure 220R is patterned to form micro LEDs. The bonding layers 211, 221R are patterned to form electrically isolated metal pads. In this example, the leftmost pixel driver 110R is for red pixels and the epitaxial structure 220R is for forming red micro LEDs. Therefore, the patterning creates a red micro LED 140R electrically connected to the leftmost pixel driver 110R. The epitaxial structure 220R is patterned to define and separate the epitaxial layers 141R for individual micro LEDs. The bonding layers 211,221R are patterned to form the lower contact metal pad 144R for the micro LED 140R.

The patterning can be done by dry etching, for example. After patterning the LED, the upper contact metal pad 142R is deposited.

The other two pixel drivers 110G,B are not for red pixels, so no red micro LED is formed above them. However, metal pads 213G,B are patterned to allow eventual electrical connection to LEDs in higher strata. As a result, the bottom stratum contains a metal pad for each micro LED in the full stack. These metal pads function either as a lower contact metal pad for the red micro LEDs or as an interconnection for the other micro LEDs. The metal pads can be aluminum, silver, rhodium, zinc, gold, germanium, nickel, chromium, platinum, tin, copper, tungsten, indium-tin-oxide, palladium, indium, titanium, and/or combinations of the above, for example.

In FIGS. 2C and 2D, the stratum is first filled and then planarized. In FIG. 2C, a thick dielectric layer 230 is deposited over the existing structure. This also provides passivation. Layer 230 is then planarized, resulting in the structure of FIG. 2D. Chemical mechanical polishing can be used to planarize the dielectric layer, leaving a planar top interface to the stratum.

In FIGS. 2E-2G, vias 143, 145 are fabricated from the planar top interface through the filling 230 to the metal pads. In FIG. 2E, deep dry etching is used to create holes leading to the metal pads 142R, 213B, 213G. In FIG. 2F, these are filled with a conductive material 244, for example TiN or tungsten. This is planarized, for example by chemical mechanical polishing, resulting in the structure of FIG. 2G with vias 143, 145. This completes the first stratum 155R.

This general process is repeated to fabricate the other strata. FIGS. 2H-2J show fabrication of the middle stratum. In FIG. 2H, an unpatterned epitaxial structure 220G is bonded on top of the prior stratum 155R. This can be done as described for the bottom stratum 155R. The epitaxial layers 220G are grown on a substrate. A metal bonding layer 221G is fabricated over the epitaxial layers 220G. A counterpart metal bonding layer 211R is also fabricated over the bottom stratum 155R. The two bonding layers 211R, 220G are bonded together. The epitaxy substrate is then removed.

In FIG. 2I, the epitaxial structure 220G and bonding layers 211R,221G are patterned to form the green micro LEDs 140G (with epitaxial layers 141G and lower contact metal pad 144G) and intermediate metal pads 213 for other micro LEDs. The upper contact metal pad 142G is also deposited. The middle stratum 155G is then filled with material 230, planarized and vias 143,145 are fabricated, resulting in the structure of FIG. 2J.

This process is repeated to fabricate the top blue stratum 155B, shown in FIG. 2K.

In FIG. 2L, a common electrode 165 is fabricated on top of the blue stratum 155B and connected by vias 163 to corresponding pads 164 to the circuitry. The common electrode 165 could be a grid of (opaque) metal traces, as shown in FIG. 3A. FIG. 3A is a top view, looking down at the device. FIG. 3A shows three micro LEDs 140R,G,B, represented by the large squares. Each of these micro LEDs has a structure 143 of vias and metal pads that electrically connect the top of the micro LED to the top of the stack of strata. These are represented by the small squares 143 in FIG. 3A. The long rectangle 165 is a metal trace that electrically connects to the vias/metal pads 143.

Figure 3B:
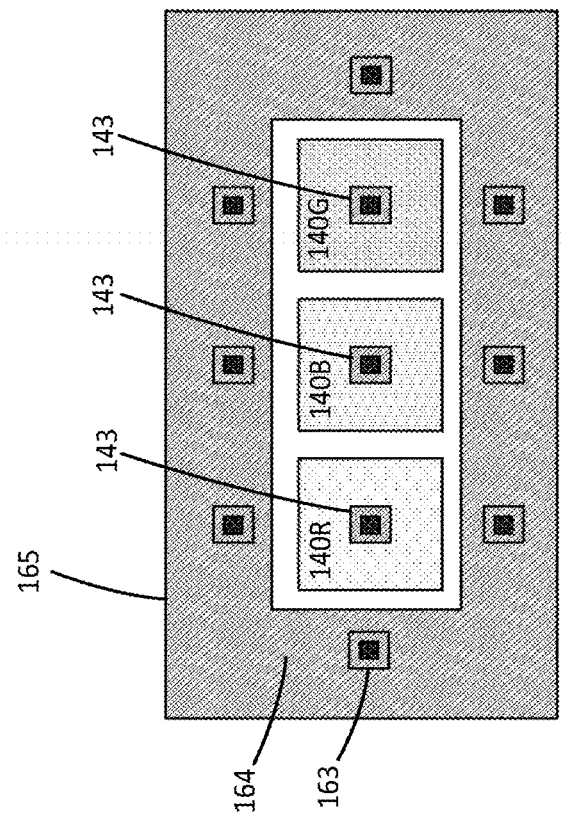
FIGS. 3A and 3B are top views of common electrodes, according to two embodiments.
Figure 3A:
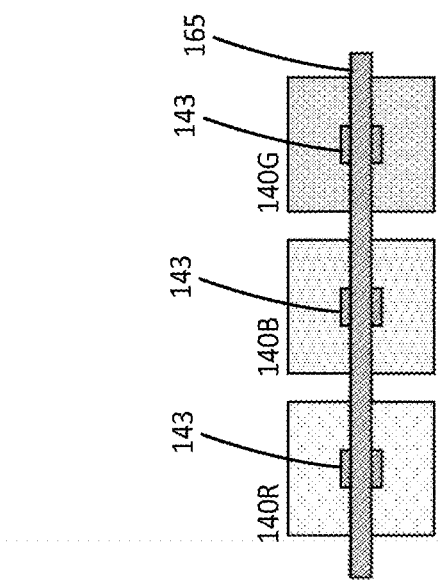

Alternatively, the common electrode 165 could be a transparent electrode, such as indium tin oxide, as shown in FIG. 3B. FIG. 3B is also a top view showing micro LEDs 140R,G,B and their interconnects 143. In this example, the common electrode 165 is the entirety of the rectangle defined by the boundary 165. It is acceptable to cover all of the micro LEDs because the electrode 165 is transparent. The rectangular annulus 164 is the metal pad connecting to the circuitry. Note that the common electrode 165 is above all the strata, while the metal pad 164 is below all the strata. They are electrically connected by vias 163.

Figure 3C:
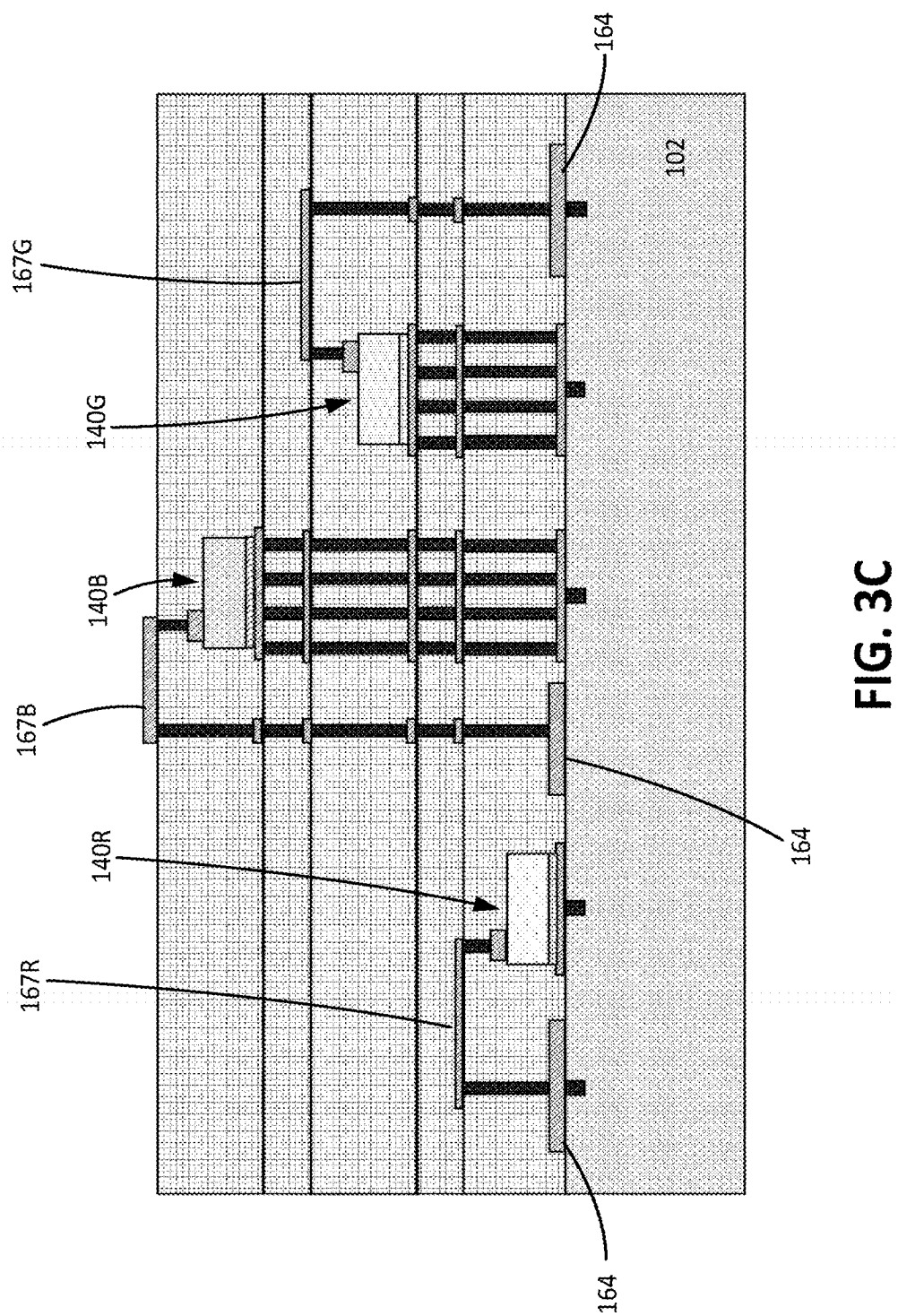
FIG. 3C is a cross-sectional view of a common electrode, according to one embodiment.

FIG. 3C shows another approach, where not every micro LED 140 is connected to the common electrode at the very top of the structure. Rather, the micro LEDs 140 of each stratum are electrically connected to the common electrode 164 by a structure 167 located on top of that particular stratum. In this example, the red micro LED 140R is connected by structure 167R, the green micro LED 140G is connected by structure 167G, and blue micro LED 140B is connected by structure 167B.

Figure 4A:
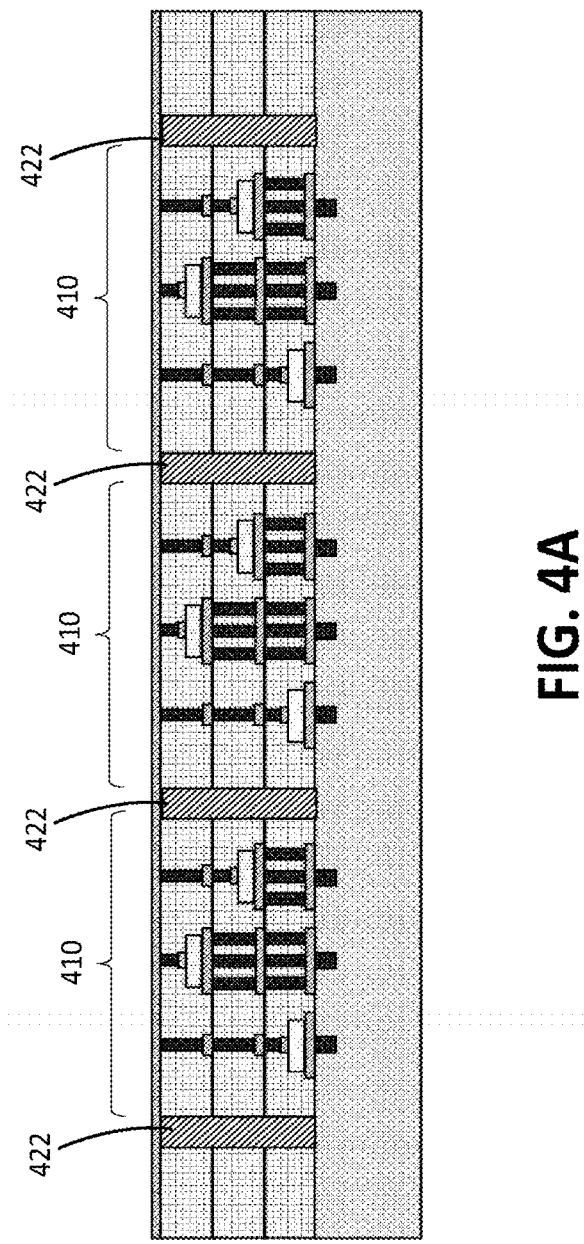
FIGS. 4A and 4B are cross-sectional views illustrating structures for optical isolation, according to one embodiment.
Figure 4B:
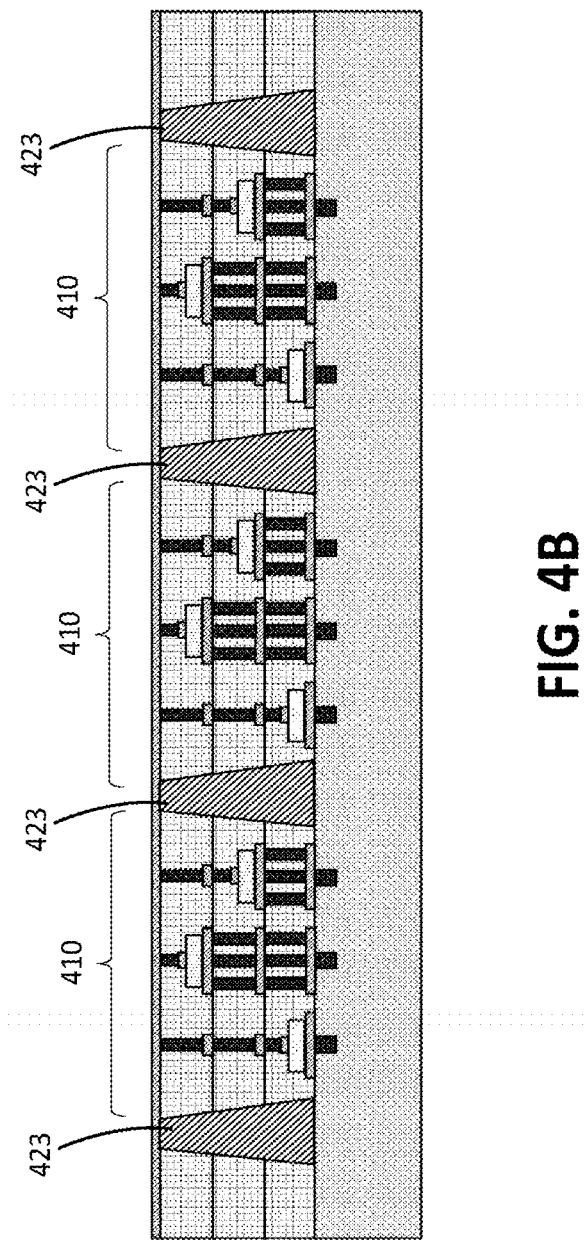

FIGS. 4A-4B illustrate additional structure that provides optical isolation of different pixels. In this example, red, green and blue pixels are grouped into multi-color pixels 410 and a structure in the strata functions to optically separate adjacent pixels. This can reduce cross-talk between adjacent multi-color pixels 410. In FIG. 4A, the structure is a grid of opaque (absorbent) dividers 422. In FIG. 4B, the structure 423 is reflective, which can also function to increase the directionality and efficiency of light production by the micro LEDs.

Figure 5:
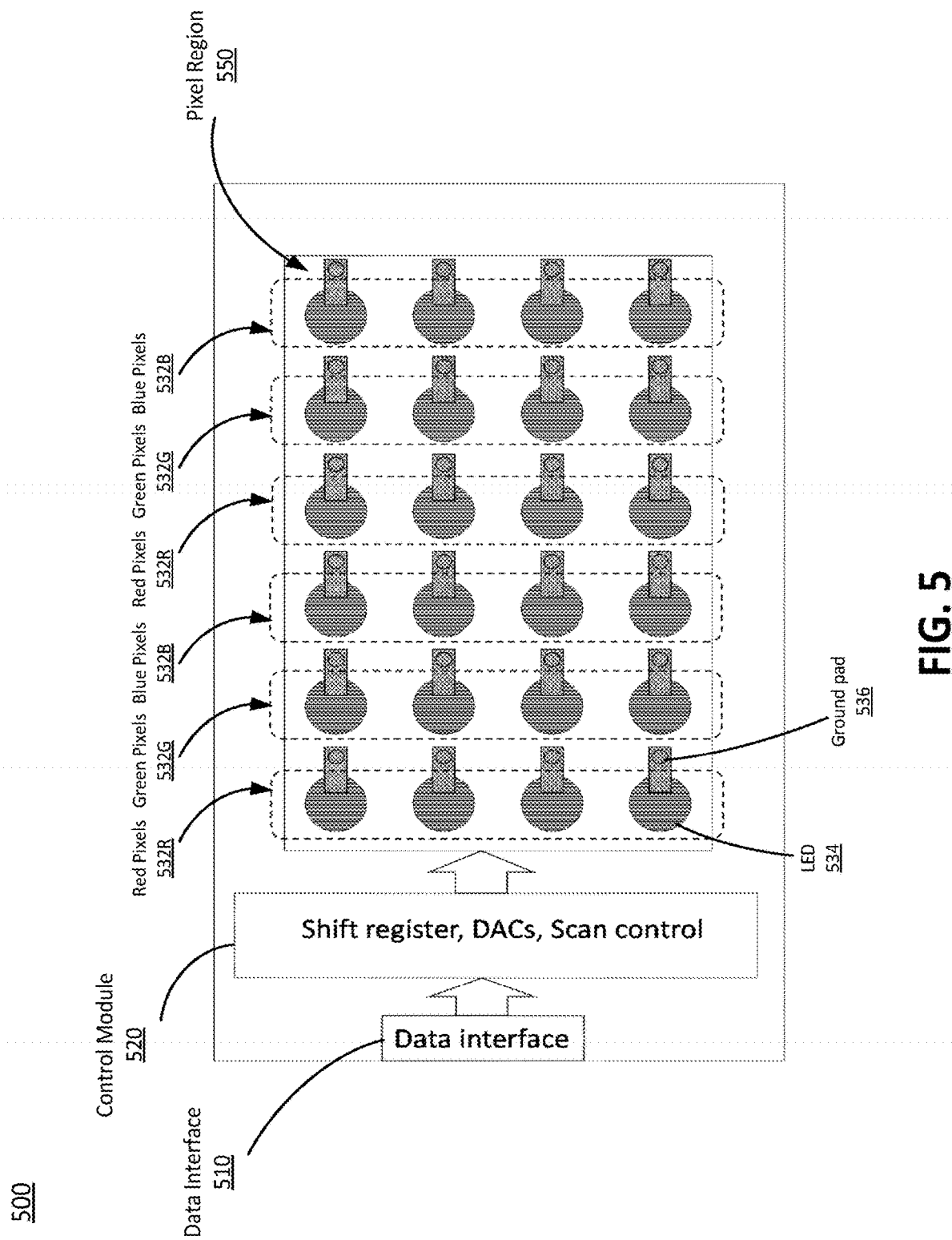
FIG. 5 is a top view of an example display panel with an array of pixels, according to one embodiment.

FIG. 5 is a top view of an example micro LED display panel 500, according to one embodiment. The display panel 500 includes a data interface 510, a control module 520 and a pixel region 540. The data interface 510 receives data defining the image to be displayed. The source(s) and format of this data will vary depending on the application. The control module 520 receives the incoming data and converts it to a form suitable to drive the pixels in the display panel. The control module 520 may include digital logic and/or state machines to convert from the received format to one appropriate for the pixel region 540, shift registers or other types of buffers and memory to store and transfer the data, digital-to-analog converters and level shifters, and scan controllers including clocking circuitry.

The pixel region 540 includes an array of pixels. The pixels include micro LEDs 534 monolithically integrated with pixel drivers, for example as described above or in the following figures. In this example, the display panel 500 is a color RGB display panel. It includes red, green and blue pixels, arranged in columns. Columns 532R are red pixels, columns 532G are green pixels and columns 532B are blue pixels. Within each pixel, an LED 534 is controlled by a pixel driver. The pixel makes contact to a supply voltage (not shown) and ground via a ground pad 536, and also to a control signal, according to the embodiments shown previously. Although not shown in FIG. 5, the p-electrode of LED and the output of the driving transistor are positioned underneath the LED 534, and they are electrically connected by bonding metal. The LED current driving signal connection (between p-electrode of LED and output of the pixel driver), ground connection (between n-electrode and system ground), the Vdd connection (between source of the pixel driver and system Vdd), and the control signal connection to the gate of the pixel driver are made in accordance with various embodiments described previously.

FIG. 5 is merely a representative figure. Other designs will be apparent. For example, the colors do not have to be red, green and blue, and there do not have to be equal numbers of each color pixel. They also do not have to be arranged in columns or stripes. A set of four color pixels could be arranged as a 2×2 square, for example. Individual pixel cells could also be arranged to share row or column addressing, thus reducing the total number of row or column traces. As one example, apart from the arrangement of a square matrix of pixels shown in FIG. 5, an arrangement of hexagonal matrix of pixels can also be used to form the display panel 500.

In some applications, a fully programmable rectangular array of pixels is not necessary. Other designs of display panels with a variety of shapes and displays may also be formed using the device structures described herein. One class of examples is specialty applications, including signage and automotive. For example, multiple pixels may be arranged in the shape of a star or a spiral to form a display panel, and different patterns on the display panel can be produced by turning on and off the LEDs. Another specialty example is automobile headlights and smart lighting, where certain pixels are grouped together to form various illumination shapes and each group of LED pixels can be turned on or off or otherwise adjusted by individual pixel drivers.

Even the lateral arrangement of devices within each pixel can vary. In FIGS. 1-4 the LEDs and pixel drivers are arranged vertically. Each LED is located "on top of" the corresponding pixel driver circuit. Other arrangements are possible. For example, the pixel drivers could also be located "behind", "in front of" or "beside" the LED.

Different types of display panels can be fabricated. For example, the resolution of a display panel can range typically from 8×8 to 3840×2160. Common display resolutions include QVGA with 320×240 resolution and an aspect ratio of 4:3, XGA with 1024×768 resolution and an aspect ratio of 4:3, HD with 1280×720 resolution and an aspect ratio of 16:9, MD with 1920×1080 resolution and an aspect ratio of 16:9, MD with 3840×2160 resolution and an aspect ratio of 16:9, and 4K with 4096×2160 resolution. There can also be a wide variety of pixel sizes, ranging from sub-micron and below to 10 mm and above. The size of the overall display region can also vary widely, ranging from diagonals as small as tens of microns or less up to hundreds of inches or more.

Different applications will also have different requirements for optical brightness. Example application include direct viewing display screens, light engines for home/office projectors and portable electronics such as smart phones, laptops, wearable electronics, and retinal projections. The power consumption can vary from as low as a few milliwatts for retinal projectors to as high as kilowatts for large screen outdoor displays, projectors, and smart automobile headlights. In terms of frame rate, due to the fast response (nanoseconds) of inorganic LEDs, the frame rate can be as high as KHz, or even MHz for small resolutions.

Although the detailed description contains many specifics, these should not be construed as limiting the scope of the invention but merely as illustrating different examples and aspects of the invention. It should be appreciated that the scope of the invention includes other embodiments not discussed in detail above. For example, the approaches described above can be applied to the integration of functional devices other than LEDs with control circuitry other than pixel drivers. Examples of non-LED devices include vertical cavity surface emitting lasers (VCSEL), photodetectors, micro-electro-mechanical system (MEMS), silicon photonic devices, power electronic devices, and distributed feedback lasers (DFB). Examples of other control circuitry include current drivers, voltage drivers, transimpedence amplifiers, and logic circuits.

Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. A micro-LED display chip, comprising:
a substrate supporting an array of pixel drivers; and
two or more strata stacked on top of the substrate and pixel drivers, with a planar interface between adjacent strata, each stratum containing an array of micro LEDs, wherein the arrays of micro LEDs for each stratum are electrically connected to the array of pixel drivers.

2. The micro-LED display chip of claim 1, wherein each stratum comprises:
an epitaxial structure forming the micro LEDs;
lower contact metal pads electrically connected to a bottom of the micro LEDs; and
upper contact metal pads electrically connected to a top of the micro LEDs;
wherein the lower contact metal pads are also electrically connected to the array of pixel drivers and the upper contact metal pads are also electrically connected to a common electrode.

3. The micro-LED display chip of claim 2, wherein the epitaxial structure of each stratum is one of a III-V nitride epitaxial structure, a III-V arsenide epitaxial structure, a III-V phosphide epitaxial structure, and a III-V antimonide epitaxial structure.

4. The micro-LED display chip of claim 2, wherein the lower contact metal pads of each stratum comprise aluminum, silver, rhodium, zinc, gold, germanium, nickel, chromium, platinum, tin, copper, tungsten, indium-tin-oxide, palladium, indium, and/or titanium.

5. The micro-LED display chip of claim 2, wherein the common electrode comprises a grid of metal traces on top of all the strata, each upper contact metal pad electrically connected to the grid of metal traces.

6. The micro-LED display chip of claim 2, wherein the common electrode comprises a transparent electrode on top of all the strata, each upper contact metal pad electrically connected to the transparent electrode.

7. The micro-LED display chip of claim 2, wherein the common electrode includes a top electrode on top of all the strata, each upper contact metal pad electrically connected to the top electrode by vias through any intervening strata.

8. The micro-LED display chip of claim 2, wherein the common electrode comprises a separate common electrode structure for each stratum located on top of that stratum, each upper contact metal pad for each stratum electrically connected to the common electrode structure for that stratum.

9. The micro-LED display chip of claim 2, wherein the lower contact metal pads of each stratum are electrically connected to the array of pixel drivers by vias through any intervening strata.

10. The micro-LED display chip of claim 2, wherein the bottom of the strata contains a metal pad electrically connected to the array of pixel drivers for each micro LED in all of the strata, the metal pad functioning as the lower contact metal pad for micro LEDs in the bottom stratum and the metal pad electrically connected to the lower contact metal pad for micro LEDs in all other strata by vias through any intervening strata.

11. The micro-LED display chip of claim 1, wherein the micro LEDs of different strata produce light of different wavelengths.

12. The micro-LED display chip of claim 11, wherein the micro LEDs of different strata produce light of different visible wavelengths.

13. The micro-LED display chip of claim 11 wherein the two or more strata are exactly three strata, and the micro LEDs are red micro LEDs for one of the strata, green micro LEDs for another one of the strata, and blue micro LEDs for a third one of the strata.

14. The micro-LED display chip of claim 11, wherein the micro LEDs of each stratum are ultraviolet, blue, green, orange, red, or infrared micro LEDs.

15. The micro-LED display chip of claim 1, wherein the micro LEDs of different strata are grouped into multi-color pixels, and the micro-LED display chip further comprises:
a structure in the strata that optically separates adjacent multi-color pixels.

16. The micro-LED display chip of claim 15, wherein the structure is either absorbent or reflective.

17. The micro-LED display chip of claim 1, wherein each stratum is transparent in regions that are laterally located above micro LEDs of lower strata, so that light produced by the micro LEDs of the lower strata are able to propagate through such regions.

18. The micro-LED display chip of claim 1, wherein the pixel drivers comprise thin-film transistor pixel drivers or silicon CMOS pixel drivers.

19. A micro-LED display chip, comprising:
a substrate supporting an array of pixel drivers; and
three strata stacked on top of the substrate and pixel drivers, with a planar interface between adjacent strata, one of the strata containing red micro LEDs, another one of the strata containing green micro LEDs, and a third one of the strata containing blue micro LEDs, each stratum further comprising:
an epitaxial structure forming the micro LEDs;
lower contact metal pads electrically connected to a bottom of the micro LEDs; and
upper contact metal pads electrically connected to a top of the micro LEDs;
wherein the lower contact metal pads are also electrically connected to the array of pixel drivers by vias through any intervening strata, and the top contact metal pads are also electrically connected to a common electrode; and
wherein each stratum is transparent in regions that are laterally located above micro LEDs of lower strata, so that light produced by the micro LEDs of the lower strata are able to propagate through such regions.

20. The micro-LED display chip of claim 19, wherein:
the common electrode includes a top electrode on top of all the strata, each upper contact metal pad electrically connected to the top electrode by vias through any intervening strata; and
the lower contact metal pads of each stratum are electrically connected to the array of pixel drivers by vias through any intervening strata.

* * * * *